United States Patent
Xiao et al.

(10) Patent No.: US 8,399,054 B2
(45) Date of Patent: Mar. 19, 2013

(54) GROWING METAL NANOWIRES

(75) Inventors: Xingcheng Xiao, Troy, MI (US); Curtis A. Wong, Macomb Township, MI (US); Anil K. Sachdev, Rochester Hills, MI (US)

(73) Assignee: Gm Global Technology Operations LLC, Detroit, MI (US)

( * ) Notice: Subject to any disclaimer, the term of this patent is extended or adjusted under 35 U.S.C. 154(b) by 549 days.

(21) Appl. No.: 12/684,253

(22) Filed: Jan. 8, 2010

(65) Prior Publication Data

US 2011/0171379 A1     Jul. 14, 2011

(51) Int. Cl.
*B05D 3/02*     (2006.01)
(52) U.S. Cl. .................................. 427/229; 427/226
(58) Field of Classification Search ............ 427/229
See application file for complete search history.

(56) References Cited

U.S. PATENT DOCUMENTS

| | | | |
|---|---|---|---|
| 6,841,013 B2 | 1/2005 | Weiner et al. | |
| 6,841,235 B2 | 1/2005 | Weiner et al. | |
| 7,081,293 B2 | 7/2006 | Weiner et al. | |
| 2004/0146735 A1* | 7/2004 | Weiner et al. | 428/606 |

* cited by examiner

*Primary Examiner* — Michael Cleveland
*Assistant Examiner* — Robert Vetere
(74) *Attorney, Agent, or Firm* — Reising Ethington P.C.

(57) ABSTRACT

A method is disclosed for growing metal (including semiconductor metal) nanowires from a film deposited on a substrate. In an illustrative embodiment tin and silicon are co-deposited, such as by sputtering, on a silicon substrate at, for example, ambient temperature. The deposited tin and silicon do not mix and the film has a tin phase dispersed in a higher melting, lower coefficient of thermal expansion, silicon phase. Upon heating, the tin expands against the silicon and expels small tin wires from the upper surface of the film. Other metal or metal alloy wires may be formed in a like manner using a matrix material and substrate in film deposition that don't mix with the metal composition and, when heated, force the expanding metal to extrude from the film surface as small diameter wires.

19 Claims, 4 Drawing Sheets

GROWING METAL NANOWIRES

TECHNICAL FIELD

This invention pertains to methods for growing metal nanowires from a co-deposited layer of the metal composition and a substantially immiscible matrix material, the layer being deposited on a suitable substrate. More specifically, this invention pertains to methods of forming and heating such co-deposited materials so that expansion of the metal phase upon heating is impeded by the matrix material and substrate, and metal nanowires are produced on the deposited layer by a growth process resembling extrusion.

BACKGROUND OF THE INVENTION

Nanowires have diameters (or principal cross-sectional thickness dimensions) of tens or hundreds of nanometers and exhibit high aspect ratios (length-to-diameter ratio), for example aspect ratios of 100 to 1000 or more. They are considered to approximate one-dimensional material shapes and they often exhibit mechanical or electrical or thermal properties not observed in bulk or three-dimensional materials of like composition.

Metal nanowires have utility in various electronic and microelectronic applications and various metal compositions have been considered for formation as nanowire structures. Nanowires, in common with nanoparticles also have the useful property of presenting a very high surface to volume ratio, a characteristic which may be advantageous in battery electrodes.

Metallic nanowires have been produced using a variety of carefully-performed and often high-cost approaches. Some current nanowire fabrication processes include photolithography, vapor-solid-liquid growth with patterning catalyst, and using templates such as anodized aluminum oxide.

One approach is described in U.S. Pat. No. 6,841,013 and its two continuation patents, each assigned to the assignee (or its designee) of this invention. The '013 patent process comprises the deposition on a substrate of a thin film (for example, about two micrometers thick) comprising a metal phase dispersed as small volumes in a host matrix phase. The film is deposited so that it displays an elevated compressive stress, and the matrix phase maintains the dispersed metal bodies under stress in a dispersed, but diffusible state. The disclosed matrix phase materials are metal nitrides, carbides, oxides, borides, and carbon based materials which may be formed in the deposition process and which immediately apply stress on the dispersed bodies of metal phase. The composite deposited film self-relieves its compressive stress by emission of metal phase material from the free surface of the film as metal nanowires. When the initial compressive stress is relieved and the film has "relaxed," the emission of nanowires slows and ceases. A sheath or cap may be applied over the deposited film to delay the emission of nanowires. Nanowire emission may then be encouraged by removing the sheath or by scratching or piercing the sheath to permit nanowire growth through it. The formation of bismuth nanowires is illustrated.

It would be advantageous to develop a method of preparing metal nanowires from thin films that permits more control and flexibility in the cross-sectional size of metal nanowires and in the timing and rate at which they may be produced.

SUMMARY OF TUE INVENTION

In a first embodiment of the invention, tin nanowires are produced as an illustration of a generic process for making metal and metal alloy nanowires. The tin nanowires are formed, on demand, by heating a deposited composite film of tin dispersed as an essentially immiscible phase in a matrix phase of silicon.

In this embodiment, tin and silicon are used cooperatively, utilizing the relatively low melting temperature (231.9° C., 505K) and relatively high coefficient of thermal expansion (CTE) (22.0 μm m$^{-1}$ K$^{-1}$) of tin and the higher melting point (1410° C., 1683K) and lower CTE (2.6 μm$^{-1}$ K$^{-1}$) of silicon. Further, tin and silicon are substantially immiscible at temperatures used in the practice of making tin nanowires by this invention. Tin and silicon may be deposited by a combinatorial sputtering process in a low pressure, high purity argon atmosphere onto a silicon substrate. A magnetic field may be used in the sputter chamber to improve the efficiency of the sputtering process and to protect the deposited film. In this embodiment, the substrate may be maintained at about room temperature (about 25° C.).

In one embodiment, silicon and tin are sputtered from separate targets into the inert gas atmosphere and they deposit as separate very small clusters of silicon atoms and tin atoms (nanometer size clusters or phases) as they accumulate on the silicon substrate. Silicon adheres to the substrate which is desirable in the following steps of the process. The silicon and tin form separate nanometer size phases, suitably with very small volumes of tin in small matrix volumes of silicon. As will be described in more detail below in this specification, the proportions of the metal phase and matrix phase constituents (often about 20% to about 80% silicon in this embodiment) may be managed to vary the diameters and amounts of the tin nanowires. The thickness of the deposited film, suitably from about 2 to about 4 micrometers, may also be adjusted to manage the amount and size of the tin (or other metal) nanowires. The as-deposited film on its complementary substrate is generally free of residual stresses and may be retained until it is desired to produce metal nanowires. It's upper surface (i.e., its surface opposite the substrate) will be a surface from which tin wires may be produced. It may be preferred to store the films in a vacuum or other non-oxidizing environment.

When tin nanowires are to be produced, the substrate and its composite film are heated to a moderate temperature below the melting point of the tin. For example, the silicon and tin film is heated in a vacuum furnace to about 180° C. As the composite film is heated the tin softens and seeks to expand against the relatively non-yielding silicon matrix and substrate. As a result of the surrounding and substantially unyielding silicon matrix and underlying silicon substrate, the expanding tin volumes self-extrude as many (depending on the amount of tin and the size of the free surface) very small cross-section wires from the free surface of the deposited film. The tin wires may be harvested from the film surface for use. The silicon may be recovered for reuse as a matrix material.

The above description illustrates the production of very small diameter (or analogous largest cross-sectional dimension) tin wires. And the description also provides the precepts for the production of small diameter wires of other metals or alloys. For example, the relatively high melting point and low CTE of silicon may make it a suitable matrix material for films with other relatively low melting point metals such as bismuth and indium that do not readily mix with silicon.

Thus, this invention provides a method for identifying and using substantially immiscible combinations of metals (and metal alloys) with higher melting matrix and substrate materials for production of nanowires. The matrix material may be an element or a mixture of elements including alloys. These immiscible combinations of materials may be co-deposited as thin films on the substrate material. The deposited films are characterized by nanometer-size volumes of a lower melting point metal composition phase confined, except for a free film surface, by a higher melting point matrix composition and a substrate material, each with relatively lower coefficients of thermal expansion. After the composite film has been formed it can be stored until needed. And then it is heated to a suitable temperature below the melting point of the dispersed metal composition, either in vacuum or inert atmosphere, so the confined metal volumes expand and extrude as nanowires on the free surface of the film.

In an illustrative embodiment, tin and silicon were deposited at the same time by a sputtering process. In other embodiments, other deposition processes may be used to co-deposit the metal material and the matrix material. For example, other deposition processes may be used such as electron beam evaporation of the materials, cathodic arc vaporization, and other physical vapor phase deposition processes.

Other objects and advantages of the invention will be apparent from a description of preferred embodiments which follows in this specification.

DESCRIPTION OF PREFERRED EMBODIMENTS

Figure 1:
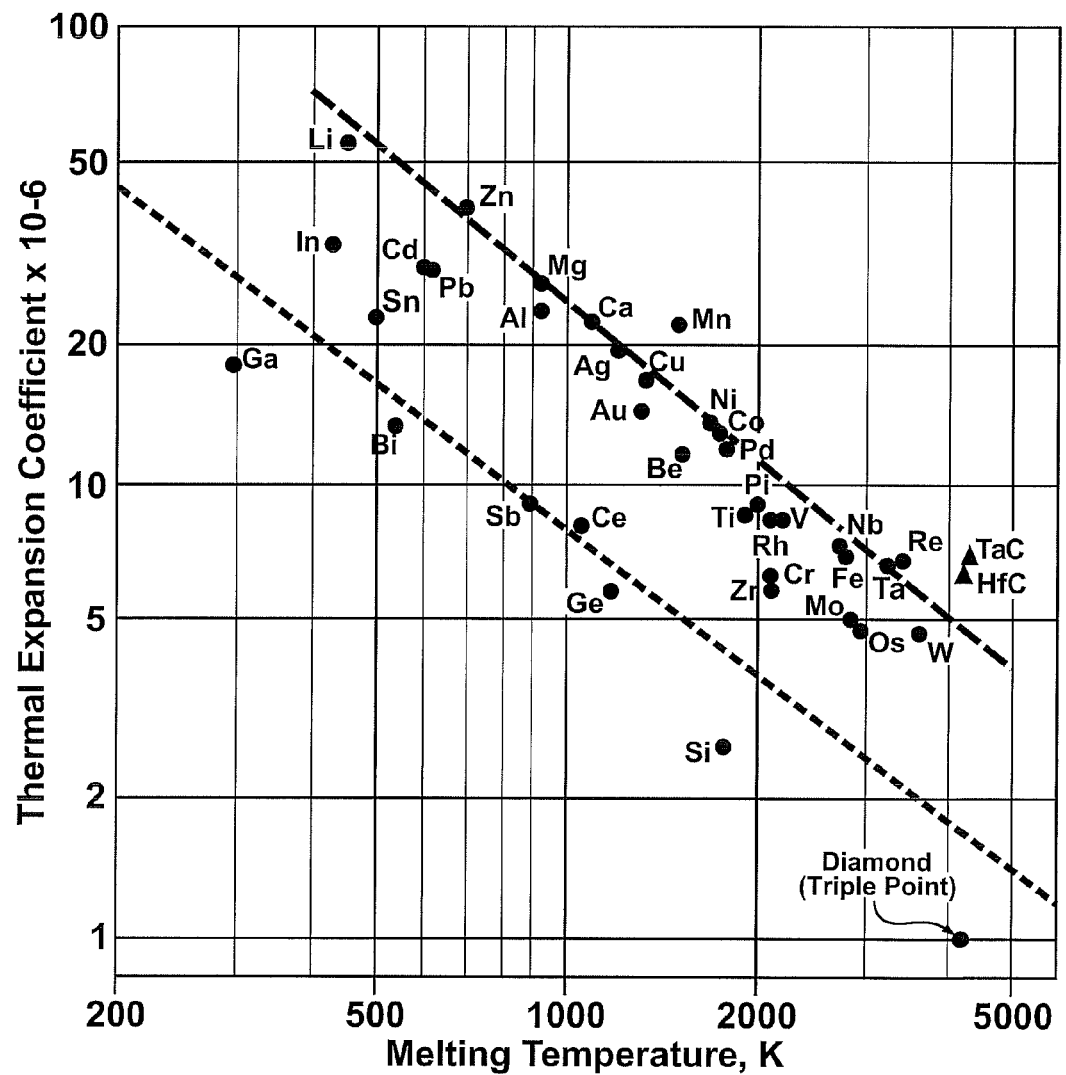
FIG. 1 shows a log-log plot of thermal expansion coefficient versus melting temperature in kelvin for a large number of metallic and metalloid elements as well as for carbon (diamond), and two refractory compounds, hafnium carbide and tantalum carbide.

Vacuum deposition refers to a family of processes used to sequentially deposit or lay down material on a solid surface or substrate, atom by atom, under reduced pressure or vacuum. When the deposited atoms derive from a bulk source, either solid or liquid, the process is termed Physical Vapor Deposition or PVD; and when the deposited atoms derive from a chemical reaction the process is termed Chemical Vapor Deposition or CVD. Further variants are known. For example, Chemical Vapor Deposition may be enhanced by conducting the process in a plasma. Each of these process variants and enhancements, whether conducted singly or in combination, may be used in practices of this invention. A suitable process may be sputtering, a process in which atoms are ejected from a solid target material due to the impact of energetic ions.

Further, deposits comprising multiple chemical species may be prepared by simultaneous or co-deposition of the chemical species or by practice of a first deposition, whether or not a co-deposition, followed by subsequent deposition.

The subject method of producing nanowires relies in a first step upon the fabrication of a thin film on a suitable substrate. The thin film is suitably vacuum deposited to achieve at least partial confinement of a metal constituent in a matrix of an immiscible second constituent. The thin film has a surface in contact with a substrate and an opposite uncovered surface.

The film is deposited so as to comprise the metal or metal alloy composition of the desired nanowires and a host or matrix constituent with which the first constituent is immiscible. The matrix constituent may be, for example, a metal, a metal alloy, a metalloid or semiconductor, or a metal compound. When these constituents are suitably selected and deposited, phase separation occurs; producing many separated metal phase nanometer-scale regions dispersed in a matrix constituent phase. The metal constituent will be characterized by a relatively high coefficient of thermal expansion (CTE) and the matrix constituent will be characterized by a relatively low coefficient of thermal expansion (CTE) and a higher melting temperature than the metal phase from which the nanowires are to be fowled. The descriptive terms "high" and "low" are used here in a relative sense to convey that the CTE of the nanowire-producing constituent is greater than the CTE of the host constituent. As will become clear subsequently, the absolute magnitude of the CTEs of these constituents is of lesser significance.

It is preferred that the substrate for the composite film also be a low coefficient of thermal expansion (CTE) material. It is further preferred that the substrate be suitable for bonding with and adhering to the second, low CTE constituent so that the deposited film is, at least over a portion of its extent, strongly bonded to the substrate. In one embodiment the second, low CTE constituent and the substrate may be of substantially identical chemical composition. Thus the high CTE constituent is constrained in the plane of the deposited film by the low CTE matrix and constrained in the substrate-facing film surface by the substrate adherently bonded to the low CTE matrix material. Only in a direction perpendicular to the second, uncovered film surface is the high CTE constituent unconstrained.

Upon increasing the temperature of the substrate and film, the substrate and film will seek to expand due to thermal expansion. The low CTE substrate which is unconstrained may freely expand; the second, low CTE constituent, particularly in an embodiment where the low CTE constituent has a composition substantially equivalent to the substrate, may expand without substantial impediment; but the largely constrained high CTE constituent has limited opportunity to expand and, as a result, is subjected to substantial stress, the magnitude of which may be estimated using the equation:

$$\sigma = E_n(\alpha_n - \alpha_s)\cdot\Delta T$$

where:
$\sigma_n$ = stress applied to nanowire-producing constituent
$E_n$ = Young's modulus of the nanowire-producing constituent
$\alpha_n$ = CTE of the nanowire-producing constituent
$\alpha_s$ = CTE of the substrate
$\Delta T$ = Temperature rise This equation may be used to predict the use of proposed combinations of nanowire-producing constituents and matrix and substrate constituents.

Thus, expansion of the dispersed phase, high CTE metal material is constrained and it will experience compressive stresses proportional to the product of the temperature rise and the difference in its CTE of those of the matrix constituent and the substrate. The CTE difference is preferably maximized since the maximum temperature rise may be limited due to melting of the high CTE constituent.

Further, the yield strength of metallic solids generally decreases with increasing temperature. Thus, the combination of an applied stress and the reduced flow stress of the high CTE constituent may promote general plastic deformation in the high CTE constituent. But, unexpectedly, the stresses generated rather promote the expulsion of high CTE nanowires from selected regions of the film, the areal density and diameter of the nanowires being dependent on the relative concentrations and distribution of the first and second phases.

Nanowire formation occurs at high homologous temperatures (the ratio of the temperature, in kelvin, and the constituent's melting point, also in kelvin), for example at a homologous temperature of about 0.9. Thus nanowire formation occurs at temperatures where atomic motion is relatively rapid and it is believed, although not relied upon, that the process of nanowire formation is fostered by diffusion acting in combination with stress, rather than by stress alone. Partial support for this viewpoint may be provided by the observation that the nanowires produced are at least one order of magnitude longer than the thickness of the film from which they are expelled.

It is generally appreciated that the coefficient of thermal expansion correlates inversely with the melting point of most solids as is conveyed by FIG. 1 which plots the logarithm of the melting temperature of selected elements and compounds against the logarithm of their CTE. Data like that presented in Table 1 may be useful in the selection, for example, of a suitable matrix element or mixture of elements for the production of nanowires of a desired metal element or mixture of elements. It is seen that the high homologous temperature required for nanowire production in the high CTE constituents reflects a much lower homologous temperature in the low CTE material. Hence with due care in the choice of the constituent-constituent system used, the required temperatures for nanowire production may be readily sustained by the second constituent and the substrate while maintaining the preferred difference in CTE.

Generally the more covalent the bond character and/or the less close packed the crystal structure, the less the coefficient of thermal expansion for a fixed melting point. Thus, for example, as shown in FIG. 1 the logarithm of the coefficients of thermal expansion of, silicon, germanium and bismuth as well as that of diamond (carbon), when plotted against the logarithm of their melting point (triple point for diamond) in kelvin fall below the trend line established by elements such as tungsten, gold and aluminum as well as the refractory compounds tantalum carbide (TaC) and hafnium carbide (HfC). Thus, to establish the maximum CTE difference the low CTE constituent may be selected from this group, or, depending on the nanowire growth temperature, it may be preferred to select one of the refractory metals such as tungsten or molybdenum.

The process may be more fully understood by reference to the following example relating to the fabrication of tin nanowires from co-deposits of silicon and tin on a silicon substrate.

Example

Fabrication of Tin Nanowires

Si and Sn were co-deposited from separate sputtering targets as a composite thin film in a combinatorial sputtering system (Gamma 1000, Surrey Nanosystems, UK). The substrates used were 3 inch diameter Si wafers maintained at room temperature or about 25° C. A shadow mask consisting of an orthogonal 6×6 array of circular holes with a diameter of about 4 mm was positioned above the substrate. Because of the relative positions of each of the holes in the array relative to the deposition source, systematic variability in composition was promoted across the array. Thus, a single nominal composition setting would result in a series of compositions, one corresponding to each of the 36 holes in the mask, enabling a wide range of tin and silicon compositions to be accessed with relatively few sample runs.

The deposition plasma for each constituent material (Si and Sn) was created with a DC power applied to each of two magnetron guns under argon flow of 14 sccm (standard cubic centimeters per minute). The dynamic pressure during the growth of the films was $3\times10^{-3}$ Torr and the substrate was maintained at room temperature. Further details of representative deposition conditions are listed in the Table.

Ex situ X-ray diffraction was used to study the structure of the thin films. Deposits were made on a copper substrate to avoid interference from the silicon substrate. Each Si—Sn pad was examined with Cu Kα radiation in a Bruker AXS general area detector diffractometer system (GADDS). The diffraction images were typically collected for a period of 5 minutes using a 0.5-mm collimator and a sample-to-detector distance of 150 mm. To avoid collision of the collimator with the sample, the primary beam incidence angle was maintained at 16° or larger, which allowed a spatial resolution of approximately 2 mm. The composition of each sample pad was determined by electron probe microanalysis (EPMA).

TABLE

Deposition conditions for SiSn composite films

| Sample | Substrate | Power (W) Si | Power (W) Sn | Deposition Rate (nanometers/sec) Si | Deposition Rate (nanometers/sec) Sn | Concentration (EPMA) at % Si | Concentration (EPMA) at % Sn | Time (minutes) |
|---|---|---|---|---|---|---|---|---|
| 1 | Si | 450 | 60 | 0.31 | 0.5 | ~50 | ~50 | 60 |
| 2 | Si | 250 | 120 | 0.18 | 0.87 | ~30 | ~70 | 45 |
| 3 | Si | 500 | 30 | 0.34 | 0.25 | ~70 | ~30 | 57 |

Heat treatment of the sputtered films was conducted in a vacuum furnace for 20 minutes at 180° C. under a pressure of $1\times10^{-3}$ TOM Heating at 180° C. produced tin nanowires from the upper surfaces of the sputtered films. The surface morphology of the Si—Sn thin films and Sn nanowires was observed by field emission scanning electron microscopy of uncoated samples under an accelerating voltage of 3 KV.

Representative results are shown in FIGS. 2-7 for samples with average (atomic) compositions of $Si_{58}Sn_{42}$ and $Si_{68}Sn_{32}$ respectively.

Figure 2:
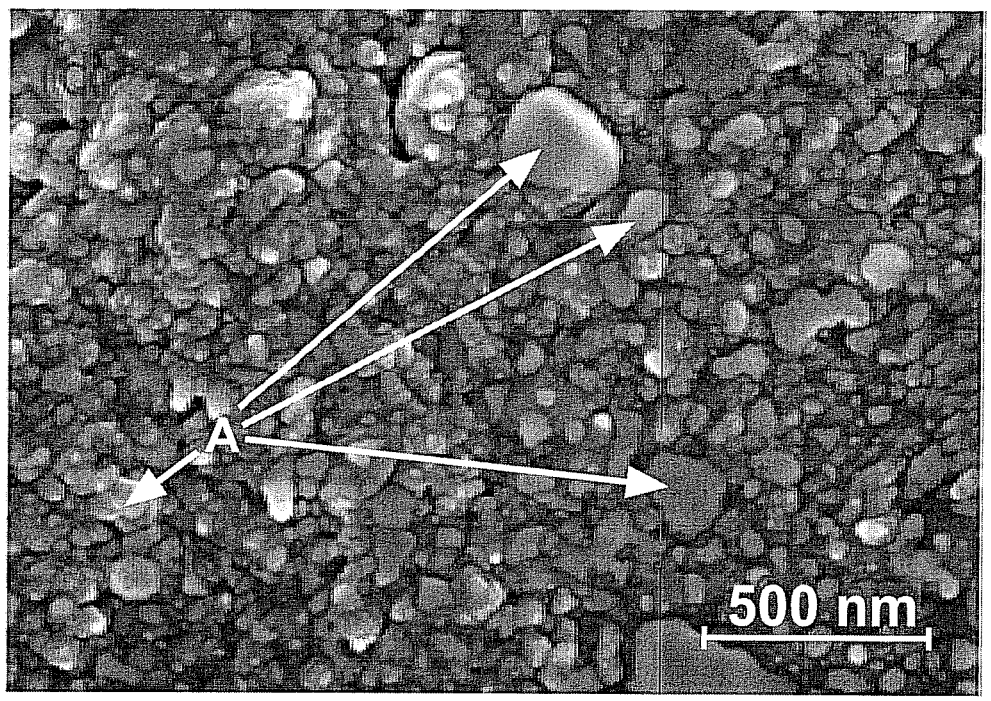
FIG. 2 is a scanning electron microscope (SEM) characterization image showing the morphology of the deposited film layer for a deposit comprising 58 atomic percent silicon and 42 atomic percent tin.
Figure 3:
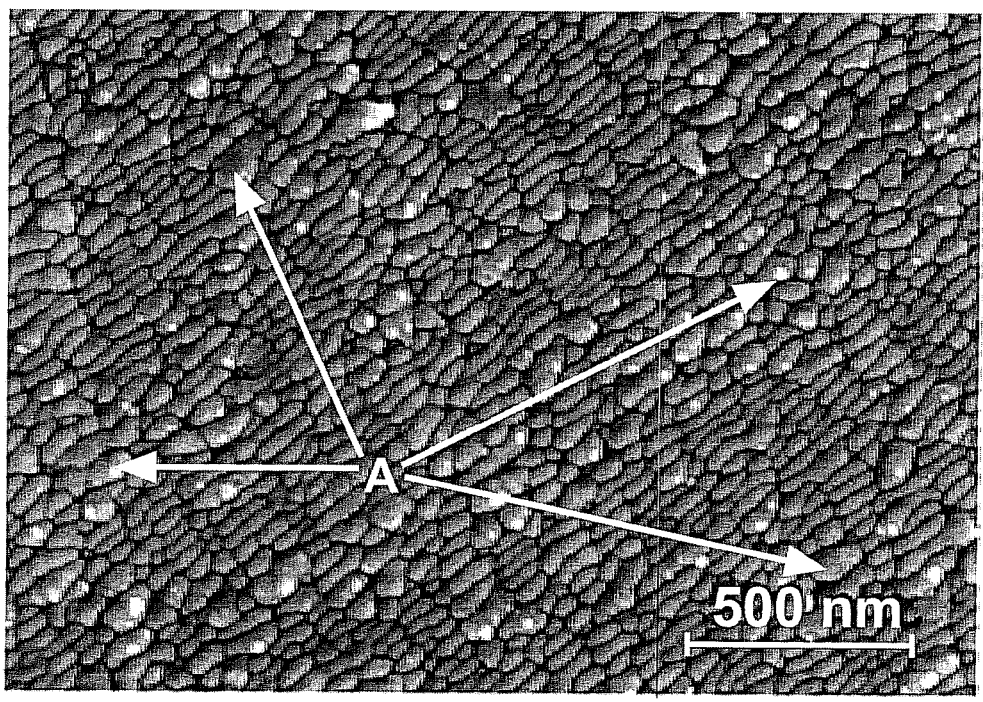
FIG. 3 is an SEM showing the morphology of the deposited layer for a deposit comprising 68 atomic percent silicon and 32 atomic percent tin.

FIG. 2 ($Si_{58}Sn_{42}$) and FIG. 3 ($Si_{68}Sn_{32}$) show the morphology of the as-deposited film and illustrate the series of generally discrete features observed indicated as A. Each film consisted of discrete bodies with generally rounded surfaces (i.e., few sharp edges) that were generally much less than 500 nanometers in largest dimension. Additional analysis disclosed that each of the observed features (bodies) comprised either substantially Sn or substantially Si in the as-deposited film and, more specifically that the Sn-rich regions were surrounded by Si-rich regions. As determined by X-ray analysis the Sn-rich regions were crystalline while the Si-rich regions were amorphous. Such behavior is expected based on the limited mobility of silicon atoms versus tin atoms as may be inferred from their respective melting points—505K for tin and 1683K for silicon. It may be observed that the scale of features A is significantly smaller and more regular for the more silicon-rich, $Si_{68}Sn_{32}$ deposit (FIG. 3), than for the $Si_{58}Sn_{42}$ deposit (FIG. 2).

Figure 4:
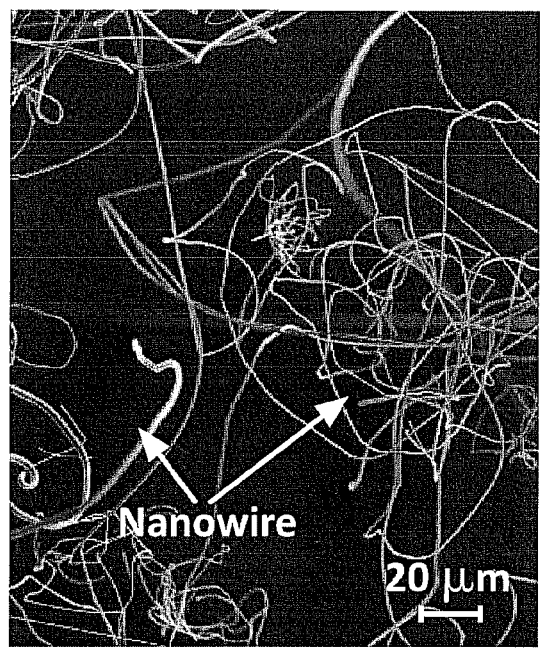
FIG. 4 is an SEM showing the morphology and dimensions of nanowires expelled from a film layer as illustrated in FIG. 2 comprising 58 atomic percent silicon and 42 atomic percent tin.
Figure 5:
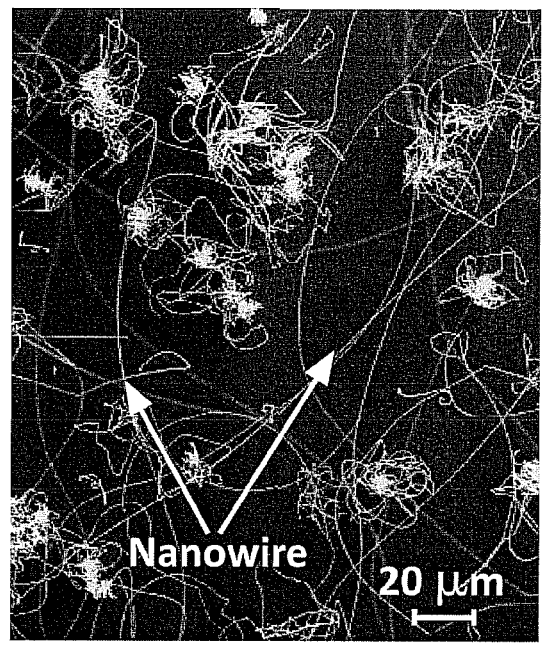
FIG. 5 is an SEM showing the morphology and dimensions of nanowires expelled from a film layer illustrated in FIG. 3 comprising 68 atomic percent silicon and 32 atomic percent tin.

FIGS. 4 and 5 illustrate the distribution and thickness of nano-wires expelled from these surfaces during a 20 minute exposure to a temperature of 453K, corresponding to about 0.9 of the melting temperature of tin (505K). The CTE of Sn is about 22 $\mu m\, m^{-1}\, K^{-1}$ compared to a CTE of 2.6 $\mu m\, m^{-1}\, K^{-1}$ for Si. Thus, this CTE mismatch will generate a compressive stress in the film since the Si substrate and Si-rich regions surrounding the Sn-rich regions constrain the expansion of the Sn phase. The high atomic mobility and the reduced flow stress of Sn at this elevated combine to expel the tin nano-wires. From comparison of FIGS. 4 and 5 it may be noted that increasing the fraction of Si (FIG. 5, $Si_{68}Sn_{32}$) increases the area density of nano-wires and reduces their diameter (cf FIG. 4, $Si_{58}Sn_{42}$). This outcome however is sustainable only up to a silicon concentration of about 80 atomic percent.

Figure 6:
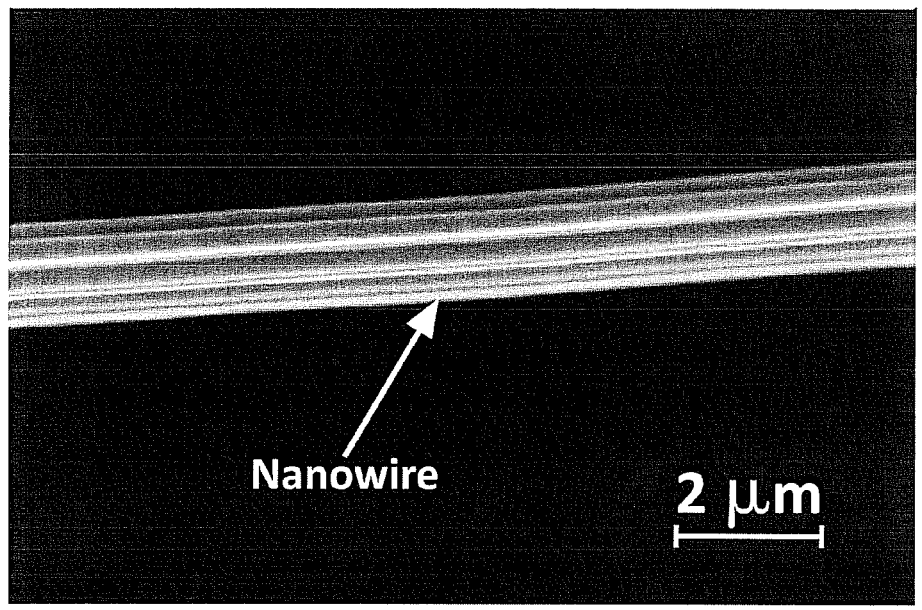
FIG. 6 is an SEM showing a detail of a typical nanowire shown in FIG. 4, that has been expelled from a deposit comprising 58 atomic percent silicon and 42 atomic percent tin.
Figure 7:
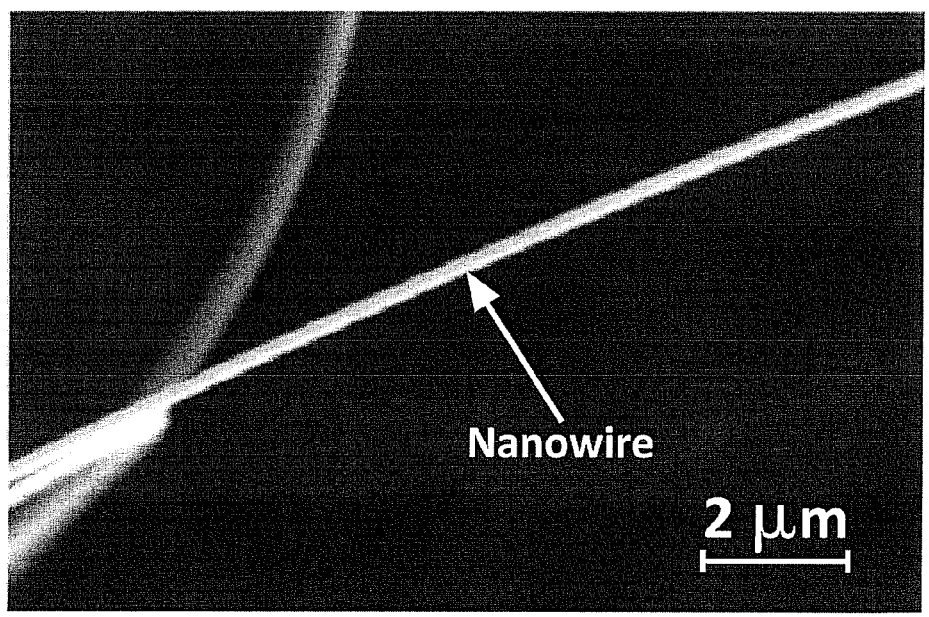
FIG. 7 is an SEM showing a detail of a typical nanowire shown in FIG. 5, that has been expelled from a deposit comprising 68 atomic percent silicon and 32 atomic percent tin.

FIGS. 6 and 7 confirm the results shown in FIGS. 4 and 5 by showing representative sections of nano-wires formed from the $Si_{58}Sn_{42}$ and $Si_{68}Sn_{32}$ deposits. FIG. 6 ($Si_{58}Sn_{42}$) shows a nanowire of about 1600 nanometer diameter while in FIG. 7 (and $Si_{68}Sn_{32}$) the nanowire diameter is only about 500 nanometers.

Note has been made of the large CTE difference between silicon and tin. The CTE difference should be substantial. For example, some experiments were conducted in which tin and silicon were deposited on a copper ($CTE_{Copper}$=16.5 $\mu m\, m^{-1}K^{-1}$) substrate, primarily for X-ray evaluation of the film composition and morphology as described above. However when these copper-substrate films were subjected to the same thermal history as the silicon-substrate films no tin nanowires were produced. Thus preferably the CTE difference will be greater than 10 $\mu m\, m^{-1}K^{-1}$ and more preferably greater than 15 $\mu m\, m^{-1}K^{-1}$.

Practices of the invention have been illustrated by disclosure of some preferred embodiments. These illustrations are of preferred embodiments and are not limitations of the scope of the invention.

The invention claimed is:

1. A method of making metal nanowires comprising:
depositing a film on a substrate, the film consisting essentially of a metal composition and a matrix composition, the metal composition having a melting temperature and a coefficient of thermal expansion, the matrix composition and the substrate each being substantially immiscible with the metal composition in the deposited film and having a higher melting temperature and lower coefficient of thermal expansion than the metal composition, the film having a surface on the substrate and an opposite uncovered surface, the film being deposited on the substrate such that the metal composition is dispersed as a phase of nanometer size volumes in a matrix composition phase and at a temperature at which the metal composition phase does not experience a force tending to expel the metal composition from the film; and, thereafter,
heating the film to a temperature below the melting temperature of the metal composition to cause at least a portion of the metal composition to be expelled from the uncovered surface of the film in the form of metal nanowires.

2. A method as recited in claim 1 in which the film is heated in a non-oxidizing atmosphere.

3. A method as recited in claim 1 in which the metal composition is a metal element.

4. A method as recited in claim 1 in which the metal composition is a metal alloy.

5. A method as recited in claim 1 in which the substrate and matrix composition is silicon.

6. A method as recited in claim 5 in which the silicon composition of the film ranges from 20% to 80%.

7. A method as recited in claim 1 in which the substrate and matrix composition is silicon and the metal composition is one or more of the elements selected from the group consisting of bismuth, indium, and tin.

8. A method as recited in claim 1 in which the metal composition and matrix composition are co-deposited on the substrate by sputtering using an inert gas that is not reactive with the metal or matrix composition.

9. A method as recited in claim 1 in which the difference in coefficient of thermal expansion of the substrate and the metal composition is greater than 10 $\mu m\, m^{-1}K^{-1}$.

10. A method as recited in claim 1 in which the difference in coefficient of thermal expansion of the matrix and the metal composition is greater than 10 $\mu m\, m^{-1}K^{-1}$.

11. A method as recited in claim 10 in which the difference in coefficient of thermal expansion of the substrate and the metal composition is greater than 10 $\mu m\, m^{-1}K^{-1}$.

12. A method of making metal nanowires comprising:
depositing a film on a substrate, the film consisting essentially of a metal composition and silicon, the metal composition having a melting temperature and a coefficient of thermal expansion, the silicon and the substrate each being substantially immiscible with the metal composition in the deposited film and having a higher melting temperature and lower coefficient of thermal expansion than the metal composition, the film having a surface on the substrate and an opposite uncovered surface, the film being deposited on the substrate such that the metal composition is dispersed as a phase of nanometer size volumes in a silicon phase and at a temperature at which the metal composition phase does not experience a force tending to expel the metal composition from the film; and, thereafter,
heating the film to a temperature below the melting temperature of the metal composition to cause at least a portion of the metal composition to be expelled from the uncovered surface of the film in the form of metal nanowires.

13. A method as recited in claim 12 in which the substrate is silicon.

14. A method as recited in claim 12 in which the metal composition comprises an element selected from the group consisting of bismuth, germanium, indium, and tin.

15. A method as recited in claim 12 in which the metal composition consists essentially of tin.

16. A method as recited in claim 12 in which the metal composition and silicon are co-deposited on the substrate by sputtering using an inert gas that is not reactive with the metal or silicon.

17. A method as recited in claim 16 in which the inert gas is argon.

18. A method as recited in claim 12 in which the silicon composition of the film ranges from 20% to 80%.

19. A method as recited in claim 12 in which the difference in coefficient of thermal expansion of the substrate and the metal composition is greater than 10 $\mu m\, m^{-1}K^{-1}$.

* * * * *